US006566996B1

(12) United States Patent
Douglass et al.

(10) Patent No.: US 6,566,996 B1
(45) Date of Patent: May 20, 2003

(54) FUSE STATE INDICATOR

(75) Inventors: Robert Stephen Douglass, Wildwood, MO (US); Matthew Rain Darr, Godfrey, IL (US); Michael Craig Henricks, Ballwin, MO (US)

(73) Assignee: Cooper Technologies, Houston, TX (US)

( * ) Notice: Subject to any disclaimer, the term of this patent is extended or adjusted under 35 U.S.C. 154(b) by 0 days.

(21) Appl. No.: 09/537,518

(22) Filed: Mar. 29, 2000

Related U.S. Application Data

(60) Provisional application No. 60/156,083, filed on Sep. 24, 1999.

(51) Int. Cl.[7] ........................ H01H 85/30; G01R 31/07; G08B 23/00; G08B 21/18

(52) U.S. Cl. ........................ 337/243; 337/244; 337/206; 337/265; 439/488; 439/489; 324/550; 340/638

(58) Field of Search ................................ 337/241, 242, 337/244, 245, 265, 266, 206, 243; 439/488, 490, 491, 622; 324/507, 550, 691; 340/638, 639; 361/835; 81/3.8; 116/202

(56) References Cited

U.S. PATENT DOCUMENTS

| | | | | | |
|---|---|---|---|---|---|
| 737,280 | A | * | 8/1903 | Sachs | 337/243 |
| 737,281 | A | * | 8/1903 | Sachs | 337/243 |
| 737,368 | A | * | 8/1903 | Downes | 337/243 |
| 737,369 | A | * | 8/1903 | Downes | 337/243 |
| 792,530 | A | * | 6/1905 | Marshall | 337/243 |
| 809,978 | A | * | 1/1906 | Ogle | 337/243 |
| 866,716 | A | * | 9/1907 | Cole | 337/243 |
| 1,014,741 | A | * | 10/1912 | Barringer et al. | 337/243 |
| 1,040,150 | A | * | 10/1912 | Cole | 337/243 |
| 1,087,120 | A | * | 2/1914 | Hooker | 337/243 |
| 2,175,250 | A | * | 10/1939 | Burrows et al. | 337/243 |
| 2,737,552 | A | * | 3/1956 | Hitchcock | 337/229 |
| 4,308,516 | A | * | 12/1981 | Shimada et al. | 337/241 |
| 4,760,367 | A | * | 7/1988 | Williams | 337/241 |
| 5,122,774 | A | * | 6/1992 | Morrill, Jr. et al. | 37/246 |
| 5,821,849 | A | * | 10/1998 | Dietsch et al. | 337/241 |
| 5,994,993 | A | * | 11/1999 | Castonguay, Jr. et al. | 337/206 |

OTHER PUBLICATIONS

Webster's II New Riverside University Dictionary, p. 249. (Copy of the page).*

* cited by examiner

*Primary Examiner*—Anatoly Vortman
(74) *Attorney, Agent, or Firm*—Armstrong Teasdale LLP

(57) ABSTRACT

A fuse state indicator includes a fuse casing having a transparent lens, a combustible substance disposed adjacent the lens, and a base layer disposed adjacent the combustible substance and having a contrasting color relative to the combustible substance. A secondary fuse indicating circuit is electrically connected to a main fuse circuit in parallel with a main fuse link, and includes a secondary fuse wire link which is disposed adjacent the combustible substance. Heat created upon vaporization of the secondary fuse link ignites the combustible substance and reveals the base layer through the lens after combustion, thereby indicating a state of the fuse as operable or inoperable by the color visible through the lens. Combustion may be assisted with an energetic chemical compound applied to secondary fuse wire link and combustible substance.

20 Claims, 4 Drawing Sheets

FUSE STATE INDICATOR

CROSS REFERENCE TO RELATED APPLICATIONS

This application claims the benefit of U.S. Provisional Application No. 60/156,083 filed Sep. 24, 1999.

BACKGROUND OF THE INVENTION

This invention relates generally to fuses and, more particularly, to fuses with a fuse state indicator.

Fuses are widely used as overcurrent protection devices to prevent costly damage to electrical circuits. Fuse terminals typically form an electrical connection between an electrical power source and an electrical component or a combination of components arranged in an electrical circuit. A fusible link is connected between the fuse terminals, so that when electrical current flowing through the fuse exceeds a predetermined limit, the fusible link melts and opens the circuit through the fuse to prevent electrical component damage.

A large number of fuses for a given electrical system are typically contained within a fuse box, and an accompanying chart lists the particular electrical devices corresponding to the fuses contained in the box. After one or more of the fuses has opened a circuit, the chart must be reviewed to discover which particular electrical device or devices in the system are not working, and the chart must then be matched against the fuse box to locate the responsible fuse or fuses. Aside from a fuse box chart, traditional fuses do not offer an adequate indicator to determine the state of a fuse, i.e., whether a given fuse is operable or inoperable. For fuse boxes that do not contain such a chart, in order to determine if a fuse is operable, or which fuse is inoperable due to an opened fuse link, each individual fuse must be removed from the fuse box and tested or replaced, which is a monotonous, time consuming process that sometimes must be repeated before locating an inoperable fuse or fuses.

While some fuse indicators have been developed for use with cylindrical cartridge fuses, recent fuses have been developed which are rectangular in shape, such as a fuse described in commonly owned U.S. Pat. No. 5,841,337. Because the rectangular fuses are relatively new to the art, a fuse indicator is needed to accommodate these fuses.

Accordingly, it would be desirable to provide a less complicated and more reliable fuse indicator system that can accommodate both a cylindrical cartridge fuse and a rectangular fuse.

BRIEF SUMMARY OF THE INVENTION

In an exemplary embodiment of the invention, a fuse state indicator includes a fuse casing having a substantially transparent lens. A combustible substance is disposed adjacent the lens and substantially coextensive therewith. A secondary fuse circuit is electrically connected in parallel with a main fuse circuit, and includes a fuse wire which is disposed adjacent the combustible substance. A noncombustible material of a contrasting color relative to the combustible substance is disposed adjacent the combustible substance and substantially coextensive therewith so that an opening of the main fuse circuit causes the fuse wire of the secondary fuse circuit to melt, thereby igniting the combustible substance. After combustion of the combustible substance, the non-combustible material is revealed through the transparent lens to indicate that the fuse is inoperable and has opened a corresponding circuit.

DETAILED DESCRIPTION OF THE INVENTION

Figure 1:
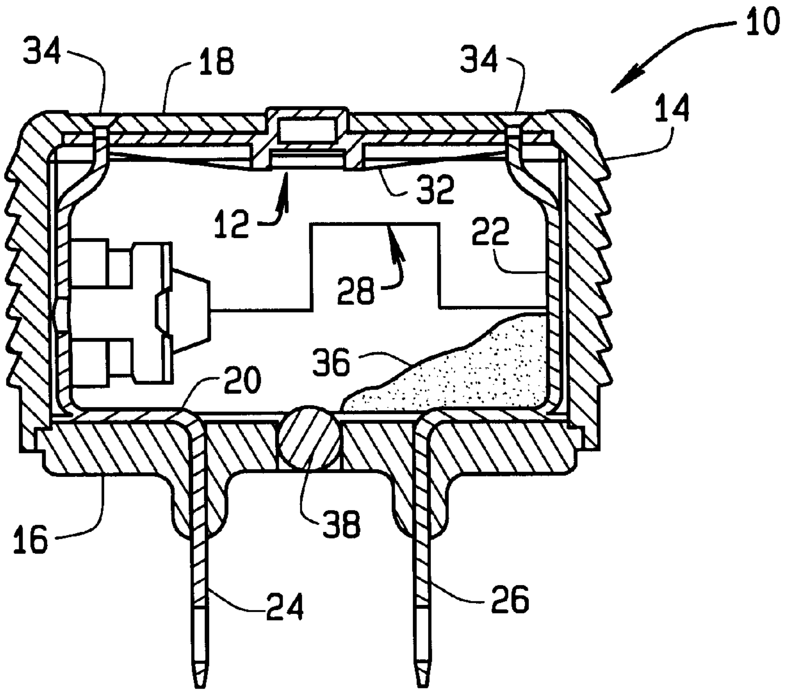
FIG. 1 is a cross sectional view of a fuse having a fuse state indicator.

FIG. 1 is a cross sectional view of a fuse module 10 including a fuse state indicator assembly 12. Fuse module 10 is generally rectangularly shaped and of the type disclosed in commonly owned U.S. Pat. No. 5,841,337, (the '377 patent) which is hereby incorporated by reference. Fuse module 10 is adapted to be mounted in a respective fuse holder (not shown), details of which are included in the '337 patent. However, it should be understood that the fuse indicator assembly may also be used in other fuse types, such as cartridge fuses, and the like.

Fuse module 10 includes a fuse casing 14 fabricated from a variety of high performance polymer materials using manufacturing processes such as injection molding. Fuse casing 14 may be integrally formed, or, alternatively, constructed from multiple parts, such as a fuse module bottom 16 and a fuse module top 18, that are adhered, connected or otherwise affixed to one another. It is recognized, however, that indicator assembly 12 of the present invention may be used with alternative types of fuses, provided that a fuse indicating circuit can be electrically connected in parallel with a main fuse circuit.

Fuse module 10 includes a first fuse terminal 20 and a second fuse terminal 22 that each include first and second terminal blades, 24, 26, respectively, extending from fuse module bottom 16. Terminal blades 24, 26 fit in corresponding slots in a fuse holder (not shown) to complete an electrical circuit (not shown). First and second terminals 20, 22 are electrically connected to a main circuit fuse link 28 forming an electrical connection therebetween. First and second terminals 20, 22 are also connected to electrical contacts (not shown in FIG. 1) of fuse state indicator assembly 12 via a secondary fuse link 32 to thereby form a parallel fuse indicating circuit between first and second terminals 20, 22. Fuse module 10 also includes test probe access ports 34 in fuse module top 18 providing access to first and second terminals 20, 22 for testing purposes.

Fuse module 10 is filled with an arc energy absorbing material 36, such as quartz sand, and sealed with a fill plug 38. Quartz sand absorbs heat generated in main fuse link 28 in an overcurrent condition, which may heat main fuse link 28 to as high as 1200° C. or more. In a particular embodiment, main fuse link 28 and secondary fuse link 32 include fine fuse wire. In alternative embodiments, main fuse link 28 and secondary fuse link 32 include other known fuse links, such as, for example, a conductive member with a narrowed segment of reduced cross sectional area that forms a fuse link.

Figure 2:
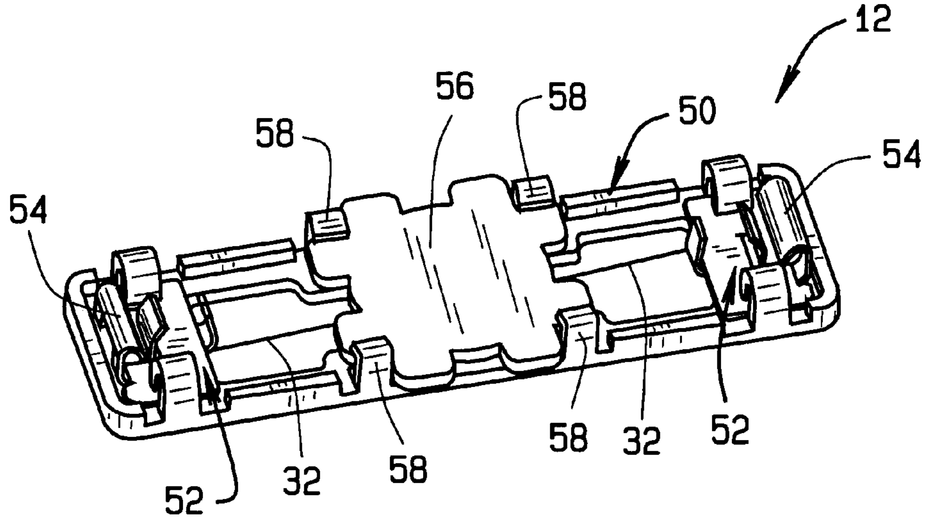
FIG. 2 is a bottom perspective view of the fuse state indicator shown in FIG. 1.

FIG. 2 is a bottom perspective view of fuse state indicator assembly 12 including a substantially transparent lens (not shown in FIG. 2) disposed on an extension member 50.

Electrical contacts 52 on either end of extension member 50 include clips 54 to engage secondary fuse link 32 and establish an electrical connection therebetween. A base layer 56 is contained within a plurality of retaining projections 58 integral to extension member 50 and shields the active components of indicator assembly 12, further described below.

Figure 3:
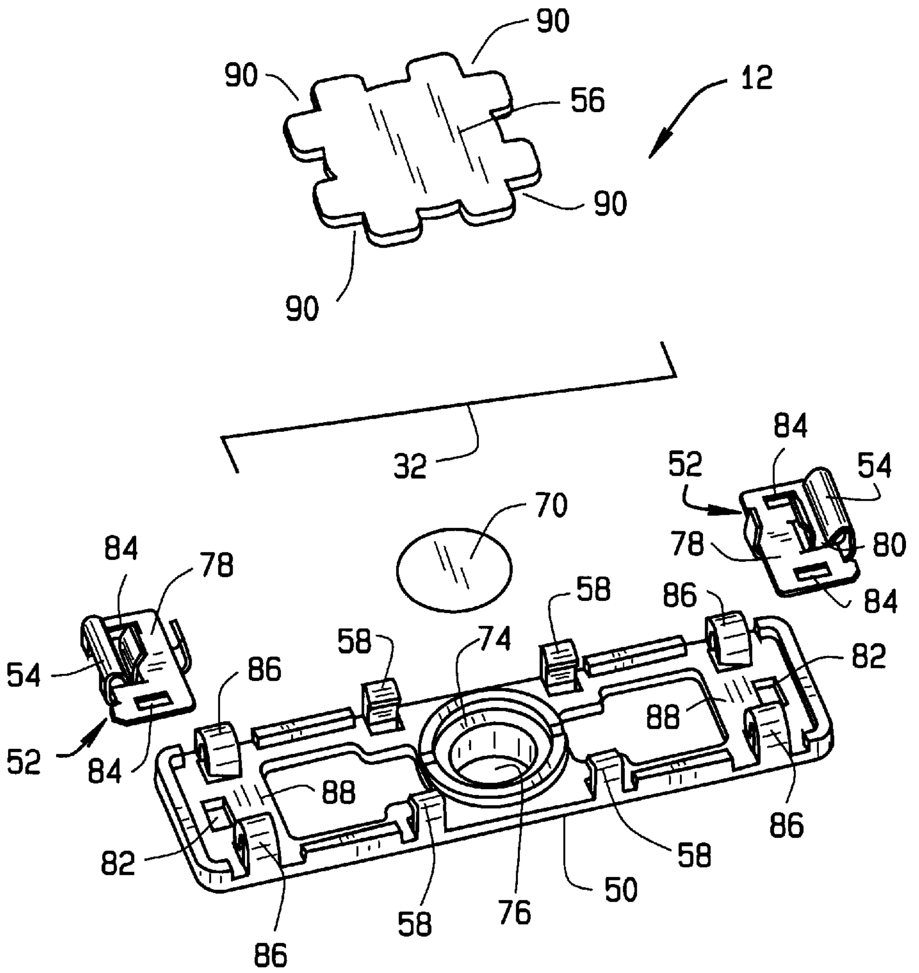
FIG. 3 is an exploded view of the fuse state indicator shown in FIG. 1.

FIG. 3 is an exploded schematic view of fuse indicator assembly 12 including extension member 50, a combustible substance 70, secondary fuse link 32, and base layer 56. Extension member 50 includes a recessed cylindrical housing 74 containing transparent lens 76 and that receives combustible substance 70. In a particular embodiment, combustible substance 70 is a tuft of nitrocellulose cotton that is easily ignitable and fills recessed cylindrical housing. Combustible substance 70 has a contrasting color relative to base layer 56, which may be any contrasting color relative to combustible substance 70 for ready indication of the fuse state, as described further below. In one embodiment, combustible substance 70 is white and base layer 56 is black.

In alternative embodiments, other readily combustible materials known in the art may be used with in lieu of nitrocellulose cotton as combustible substance 70. For example, pure nitrocellulose, combustible substances such as cellulose paper, polymer film, polymer felt, and cellulose felt may be used within the scope of the present invention. In these alternative embodiments, combustible substance is located adjacent and/or within recessed cylindrical housing 74 in various forms, including but not limited to circular disks that are 0.001 inches to 0.010 inches thick and is larger in circular dimension than transparent lens 76 so that combustible substance 70 extends beyond transparent lens 76 and recessed cylindrical housing 74.

Secondary fuse link 32 extends between electrical contacts 52 on either end of extension member 50. Secondary fuse link 32 is a fine wire selected to melt at a designated current in accordance with a desired amperage rating of fuse module 10 (shown in FIG. 1). Secondary fuse link 32 may be fabricated from a variety of materials known in the art, including but not limited to copper, and copper alloys including zinc, nickel, chromium, tin, iron, molybdenum, aluminum, berylium, and silicon.

Each electrical contact 52 includes a contact plate 78 having a rectangular aperture 80 coextensive with a rectangular aperture 82 on either end of extension member 50 for connection to first and second fuse terminals 20, 22 (shown in FIG. 1). Contact plates 78 further include substantially rectangular retaining apertures 84 for snap-fit engagement with electrical contact retaining members 86 extending from a bottom surface 88 of extension member 50. Contact clips 54 of contact plates 78 form an electrical connection with secondary fuse link 32 that extends between electrical contacts 52 and adjacent combustible substance 70. It is recognized that other complementary shapes of projections and apertures of contact plates 78 and extension member 50 could be used in lieu of those shown in the drawings and described herein. Contact clips 54 may be fabricated from a variety of materials known in the art, including but not limited to copper, and copper alloys including zinc, nickel, chromium, tin, iron, molybdenum, aluminum, berylium, and silicon.

Base layer 56 is fabricated from a relatively noncombustible material relative to combustible substance 70, and is contrasting in color relative to combustible substance 70. In a particular embodiment, base layer 56 is fabricated from black plastic, and includes cutout corners 90 for snap fit engagement with extension member base retaining projections 58.

Figure 4:
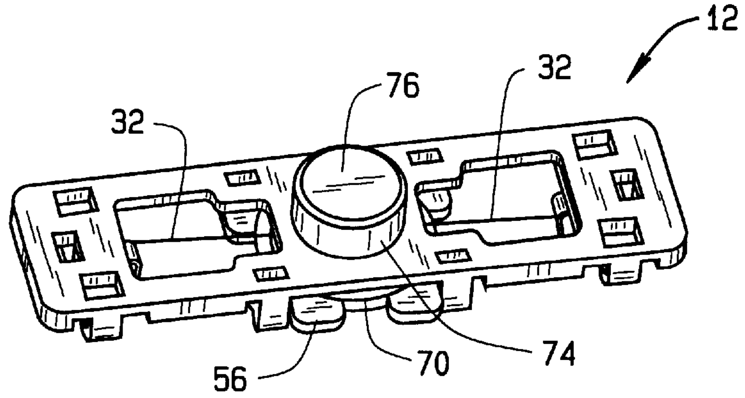
FIG. 4 is a top perspective view of the fuse state indicator shown in FIG. 1.

FIG. 4 is a top perspective view of assembled fuse indicator assembly 12 including transparent lens 76 attached to extension member recessed cylindrical housing 74. When cylindrical housing 74 is inserted into a complementary aperture (not shown) in fuse module top 18 (shown in FIG. 1), transparent lens 76 is substantially flush with fuse module top 18 (shown in FIG. 1). Transparent lens 76 is fabricated from suitable materials known in the art, such as polycarbonate, polysulfone, polyethersulfone, and acrylic.

Combustible substance 70 rests on base layer 56 at a distance below transparent lens 76. In one embodiment, combustible substance 70 fills cylindrical housing 74 and contacts transparent lens 76. In an alternative embodiment, combustible substance 70 only partially fills cylindrical housing 74, thereby creating an insulating air gap (not shown) between transparent lens 76 and combustible substance 70 that both provides for combustion of combustible substance 70 and protects transparent lens 76 from the associated heat when secondary fuse link 32 ignites combustible substance 70.

Figure 5:
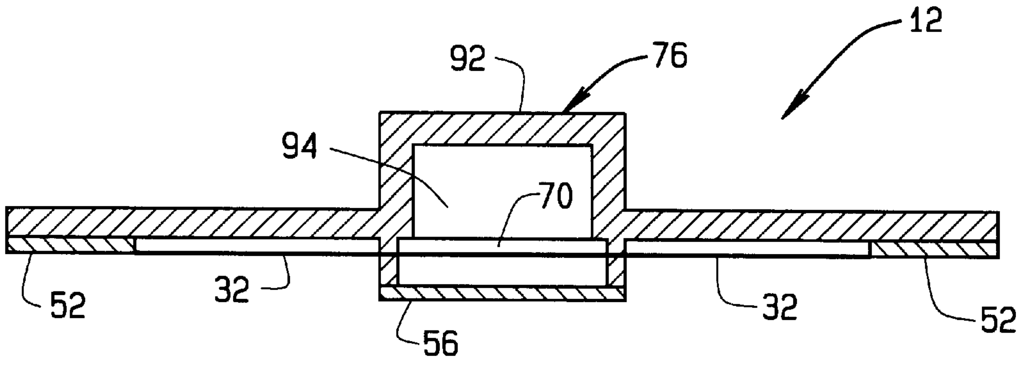
FIG. 5 is a functional schematic of the fuse state indicator shown in FIG. 4 before the fuse has opened.
Figure 6:
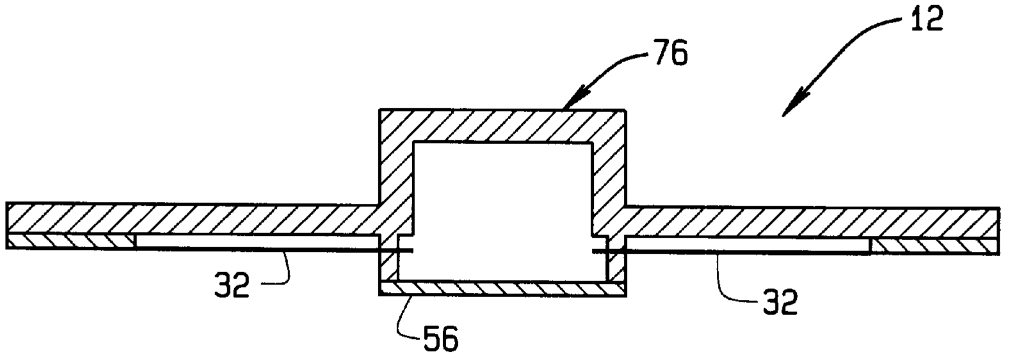
FIG. 6 is a functional schematic of the fuse state indicator shown in FIG. 4 after the fuse has opened.

FIGS. 5 and 6 are schematic drawings of fuse state indicator assembly 12 before and after, respectively, that secondary fuse link 32 has melted to open an associated circuit (not shown). FIG. 5 illustrates an assembled fuse indicator assembly 12 including combustible substance 70 disposed adjacent and extending beyond transparent lens 76. Combustible substance 70 is visible through top 92 of transparent lens 76.

Base layer 56 is disposed adjacent and extends beyond combustible substance 70 so as to be concealed or hidden from view by combustible substance 70 when viewed through top 92 of transparent lens 76. Base layer 56 is of a contrasting color relative to combustible substance 70, and is generally coextensive with combustible substance 70. Disposed between combustible substance 70 and base layer 56 is secondary fuse link 32 electrically connected in parallel to a main fuse link 28 (shown in FIG. 1) through electrical contacts 52.

When main fuse link 28 (shown in FIG. 1) opens due to a fault current, the fault current flows through parallel secondary fuse link 32, which causes secondary fuse link 32 to melt or vaporize. The resultant heat ignites combustible substance 70, and combustible substance 70 is consumed by confined burning within recessed housing 74. Referring now to FIG. 6, when the combustion is complete, base layer 56 is visible through transparent lens 76.

Thus, a fuse state is indicated by a visible change of color from, for example, a light color to a dark color, as seen through top 92 of transparent lens 76 that reflects the respective colors of combustible substance 70 and base layer 56. To an observer viewing the indicator transparent lens 76, when main fuse link 28 is operable, i.e., has not melted or opened, combustible substance 70 is visible through transparent lens 76, as shown in FIG. 5. However, when main fuse link 28 is inoperable due to melting or opening from a fault current, the fault current vaporizes secondary fuse link 32, igniting and combusting combustible substance 70, thereby revealing the contrasting colored base layer 56 so that it is visible through transparent lens 76, as shown in FIG. 6.

In alternative embodiments, backing layer 56 is only partially concealed by combustible substance 70 when main fuse link 28 has not opened. For example, a light-colored stripe of combustible substance 70 may cross a dark-colored base layer 56 such that the stripe is visible when main fuse link 28 has not opened, and the stripe is combusted when main fuse link 28 has opened so that only-colored base layer 46 is visible through top 92 of transparent lens 76. In a further alternative embodiment, base layer includes text and/or graphics that become visible when combustible substance is combusted to indicate the state of fuse 10 (shown in FIG. 1).

Figure 7:
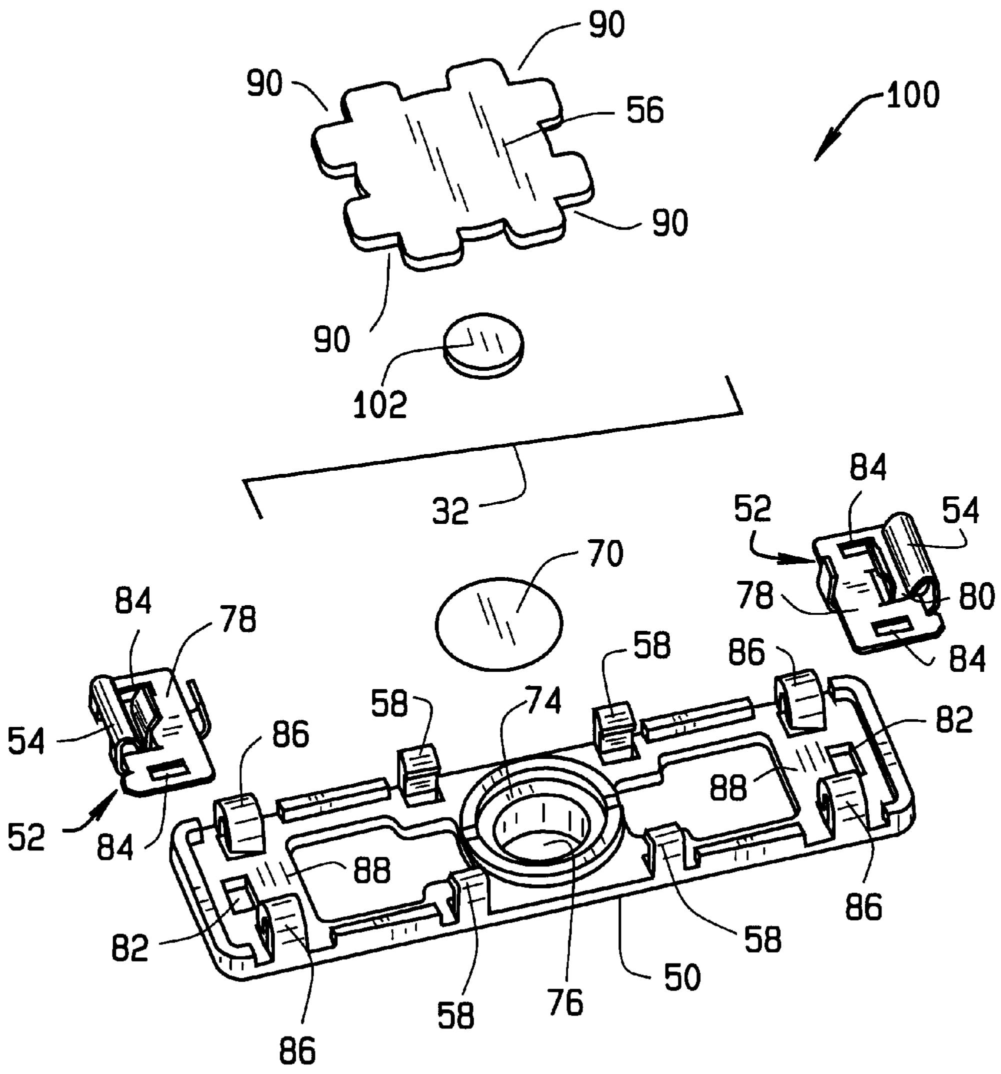
FIG. 7 is a view similar to FIG. 3 but illustrating a second embodiment of a fuse state indicator.

FIG. 7 is an exploded view of a second embodiment of a fuse indicator assembly 100 that is constructed substantially similar to fuse indicator assembly 12 (described above and shown in FIG. 3) but with the addition of an energetic chemical compound 102 to facilitate ignition of combustible substance 70. Therefore, common elements of fuse indicator assemblies 12, 100, respectively, are indicated with like reference characters.

Energetic chemical compound 102 is applied over secondary fuse link 32 and combustible substance 70, and includes an oxidizer, a fuel, a binder, and an adhesive. Energetic chemical compound 102 is about 50% to about 80% oxidizer by volume, about 10% to about 25% fuel, and about 10% to about 25% binder and adhesive. For example, in a particular embodiment, energetic chemical compound 102 is about 72% oxidizer, about 14% fuel and about 14% binder and adhesive by volume. The oxidizer, fuel, binder and adhesive may be selected from known materials and mixed according to known methods and techniques. In an illustrative embodiment, for example, the oxidizer is potassium chlorate, the fuel is sulfur, and animal glue serves as both an adhesive and a binder. Of course, a separate binder, such as silica, could be used with other adhesives to form energetic chemical compound 102.

Energetic chemical compound 102 is applied to secondary fuse link 32 and combustible substance 70, and secondary fuse link 32 is electrically connected in parallel to a main fuse link 28 (shown in FIG. 1) through electrical contacts 52. When main fuse link 28 (shown in FIG. 1) opens due to a fault current, the fault current flows through parallel secondary fuse link 32, which causes secondary fuse link 32 to melt or vaporize. The resultant heat ignites energetic chemical compound 102 applied to secondary fuse link 32 and combustible substance 70, thereby igniting combustible substance 70. Combustible substance 70 is consumed by the confined burning of both energetic chemical compound 102 and combustible substance 70. Thus, when the combustion is complete, base layer 56 is visible through transparent lens 76.

While the invention has been described in terms of various specific embodiments, those skilled in the art will recognize that the invention can be practiced with modification within the spirit and scope of the claims.

What is claimed is:

1. A fuse state indicator for a fuse including a main fuse circuit and a main fuse link, said fuse state indicator comprising:

a transparent lens;

a readily combustible substance adjacent the lens;

a secondary fuse link adjacent said readily combustible substance, said secondary fuse link configured to be electrically connected in parallel to the main fuse link; and a backing layer adjacent said secondary fuse link and at least partially concealed by said readily combustible substance when viewed through said transparent lens before the fuse has opened, said readily combustible substance substantially completely ignited and consumed after the fuse has opened.

2. A fuse state indicator in accordance with claim 1 further comprising an energetic chemical compound applied to said combustible substance and said fuse link.

3. A fuse state indicator in accordance with claim 2 wherein said energetic chemical compound comprises an oxidizer, a fuel, a binder and an adhesive.

4. A fuse state indicator in accordance with claim 3 wherein said oxidizer is potassium chlorate, said fuel is sulfur, and said adhesive is animal glue.

5. A fuse state indicator in accordance with claim 2 wherein said secondary fuse link comprises fuse wire.

6. A fuse state indicator in accordance with claim 2 wherein said combustible substance and said backing layer have contrasting colors.

7. A fuse state indicator in accordance with claim 6 wherein said combustible substance is white.

8. A fuse state indicator in accordance with claim 1 wherein said combustible substance is nitrocellulose cotton.

9. A fuse for protecting electrical components in a circuit, said fuse comprising:

first and second terminals for connection to the circuit;

a transparent lens;

a main fuse link electrically connected between said first and second terminals; and a fuse indicator assembly comprising a secondary fuse link electrically connected between said first and second terminals, a combustible substance adjacent said secondary fuse link, said combustible substance adjacent said transparent lens, said combustible substance substantially completely combusted when said secondary fuse link operates, and a backing layer adjacent said secondary fuse link.

10. A fuse in accordance with claim 9 wherein at least a portion of said combustible substance visible through said transparent lens before said main fuse link is opened.

11. A fuse in accordance with claim 10 wherein said combustible substance and said backing layer have contrasting colors.

12. A fuse accordance with claim 11 wherein said combustible substance is white.

13. A fuse in accordance with claim 9 wherein said combustible substance is nitrocellulose cotton.

14. A fuse in accordance with claim 13 further comprising an energetic chemical compound applied to said combustible substance and said fuse link.

15. A fuse state indicator in accordance with claim 14 wherein said energetic chemical compound comprises an oxidizer, a fuel, a binder and an adhesive.

16. A fuse state indicator in accordance with claim 15 wherein said oxidizer is potassium chlorate, said fuel is sulfur, and said adhesive is animal glue.

17. A method of indicating an operated fuse, said fuse including a main fuse link electrically connected between first and second terminals, and a fuse indicator assembly including a transparent lens, a combustible substance, a secondary fuse link and a backing layer, said method comprising the steps of:

attaching said combustible substance adjacent the lens so that at least a portion of the combustible substance is visible through the lens;

electrically connecting the secondary fuse link to the first and second terminals in parallel with the main circuit and positioning the fuse link adjacent the combustible substance; and attaching the backing layer adjacent the secondary fuse link, the secondary fuse link vaporizing and substantially completely combusting the combustible substance when current flows through the secondary fuse link after the main fuse link has opened, thereby revealing the backing layer and indicating a state of the fuse.

18. A method in accordance with claim 17 further comprising the step of applying an energetic chemical compound to the secondary fuse link and the combustible substance, the energetic chemical compound igniting in response to heat generated in the secondary fuse link.

19. A method in accordance with claim 17 wherein said step of attaching the combustible substance comprises the step of forming a gap between the combustible substance and a surface of the lens to provide combustion air and insulate the lens from heat generated when the secondary fuse link opens.

20. A method in accordance with claim 17 wherein said step of electrically connecting the secondary fuse link comprises the step of attaching a fuse wire between first and second electrical contacts, such that the fuse wire is adjacent the transparent lens.

* * * * *